United States Patent
Toko et al.

(10) Patent No.: US 10,622,545 B2
(45) Date of Patent: Apr. 14, 2020

(54) MAGNETIC MEMORY DEVICE AND METHOD OF MANUFACTURING THE SAME

(71) Applicant: TOSHIBA MEMORY CORPORATION, Minato-ku, Tokyo (JP)

(72) Inventors: Masaru Toko, Seoul (KR); Keiji Hosotani, Yokkaichi Mie (JP); Hisanori Aikawa, Seoul (KR); Tatsuya Kishi, Seongnam-si (KR)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/702,403

(22) Filed: Sep. 12, 2017

(65) Prior Publication Data

US 2018/0277744 A1 Sep. 27, 2018

(30) Foreign Application Priority Data

Mar. 21, 2017 (JP) .................. 2017-054910

(51) Int. Cl.
| | | |
|---|---|---|
| H01L 43/02 | (2006.01) | |
| H01L 43/12 | (2006.01) | |
| H01L 43/10 | (2006.01) | |
| H01L 43/08 | (2006.01) | |
| H01L 27/22 | (2006.01) | |

(52) U.S. Cl.
CPC ............ *H01L 43/02* (2013.01); *H01L 27/228* (2013.01); *H01L 43/08* (2013.01); *H01L 43/10* (2013.01); *H01L 43/12* (2013.01)

(58) Field of Classification Search
CPC ......... H01L 43/02; H01L 43/08; H01L 43/10; H01L 43/12
See application file for complete search history.

(56) References Cited

U.S. PATENT DOCUMENTS

| | | | |
|---|---|---|---|
| 8,698,260 B2 | 4/2014 | Jan et al. | |
| 8,962,349 B1* | 2/2015 | Chen | H01L 43/12 257/421 |
| 2005/0019610 A1* | 1/2005 | Fujikata | B82Y 10/00 428/811.1 |
| 2007/0253118 A1* | 11/2007 | Hayakawa | B82Y 25/00 360/324.2 |
| 2008/0140922 A1 | 6/2008 | Higo et al. | |
| 2011/0188157 A1* | 8/2011 | Zhao | G01R 33/093 360/313 |

(Continued)

FOREIGN PATENT DOCUMENTS

| | | |
|---|---|---|
| JP | 2008147522 A | 6/2008 |
| TW | 201419598 A | 5/2014 |

*Primary Examiner* — Zandra V Smith
*Assistant Examiner* — Andre C Stevenson
(74) *Attorney, Agent, or Firm* — Holtz, Holtz & Volek PC

(57) ABSTRACT

According to one embodiment, a magnetic memory device includes a first magnetic layer having a variable magnetization direction, a first non-magnetic layer provided on the first magnetic layer, and a second magnetic layer provided on the first magnetic layer and having a fixed magnetization direction and provided on the first magnetic layer. The second magnetic layer includes a non-magnetic metal including at least one of Mo (molybdenum), Ta (tantalum), W (tungsten), Hf (hafnium), Nb (niobium) and Ti (titanium).

20 Claims, 13 Drawing Sheets

(56) References Cited

U.S. PATENT DOCUMENTS

| | | | |
|---|---|---|---|
| 2012/0218813 A1* | 8/2012 | Oh | G11C 11/161 |
| | | | 365/158 |
| 2013/0307102 A1 | 11/2013 | Oh et al. | |
| 2014/0353783 A1* | 12/2014 | Oh | H01L 43/08 |
| | | | 257/421 |
| 2016/0013397 A1* | 1/2016 | Kitagawa | H01L 43/08 |
| | | | 257/421 |
| 2016/0365506 A1* | 12/2016 | Ahn | H01L 43/08 |
| 2016/0380182 A1 | 12/2016 | Watanabe et al. | |
| 2018/0025775 A1* | 1/2018 | Ambrose | G11C 11/44 |
| | | | 257/35 |

* cited by examiner

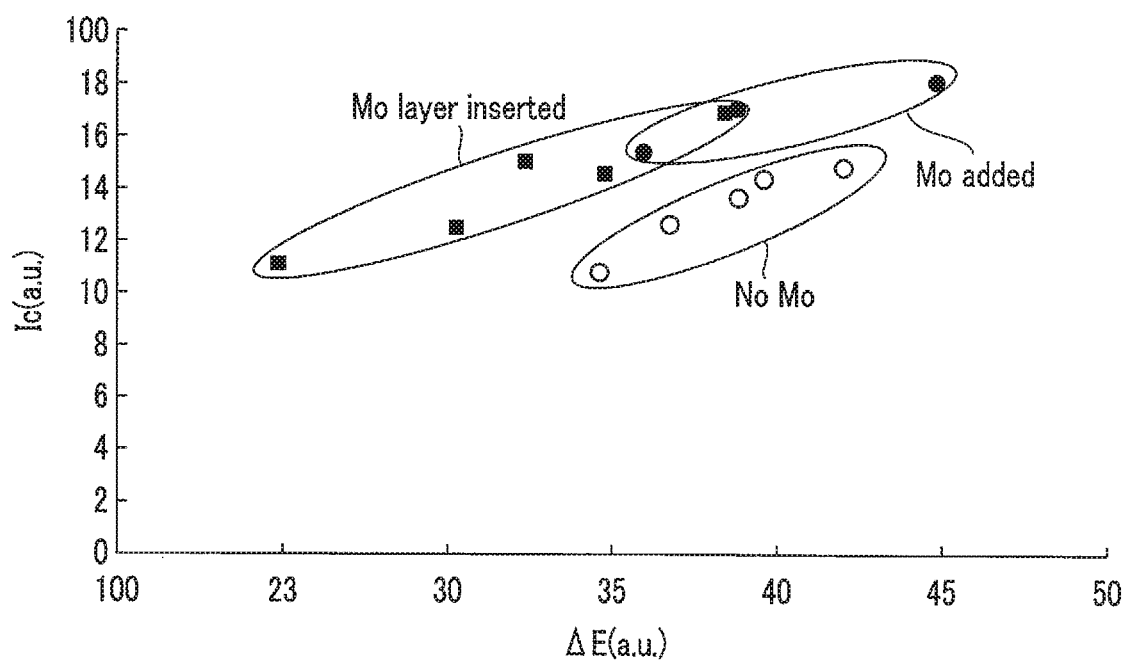
F I G. 1

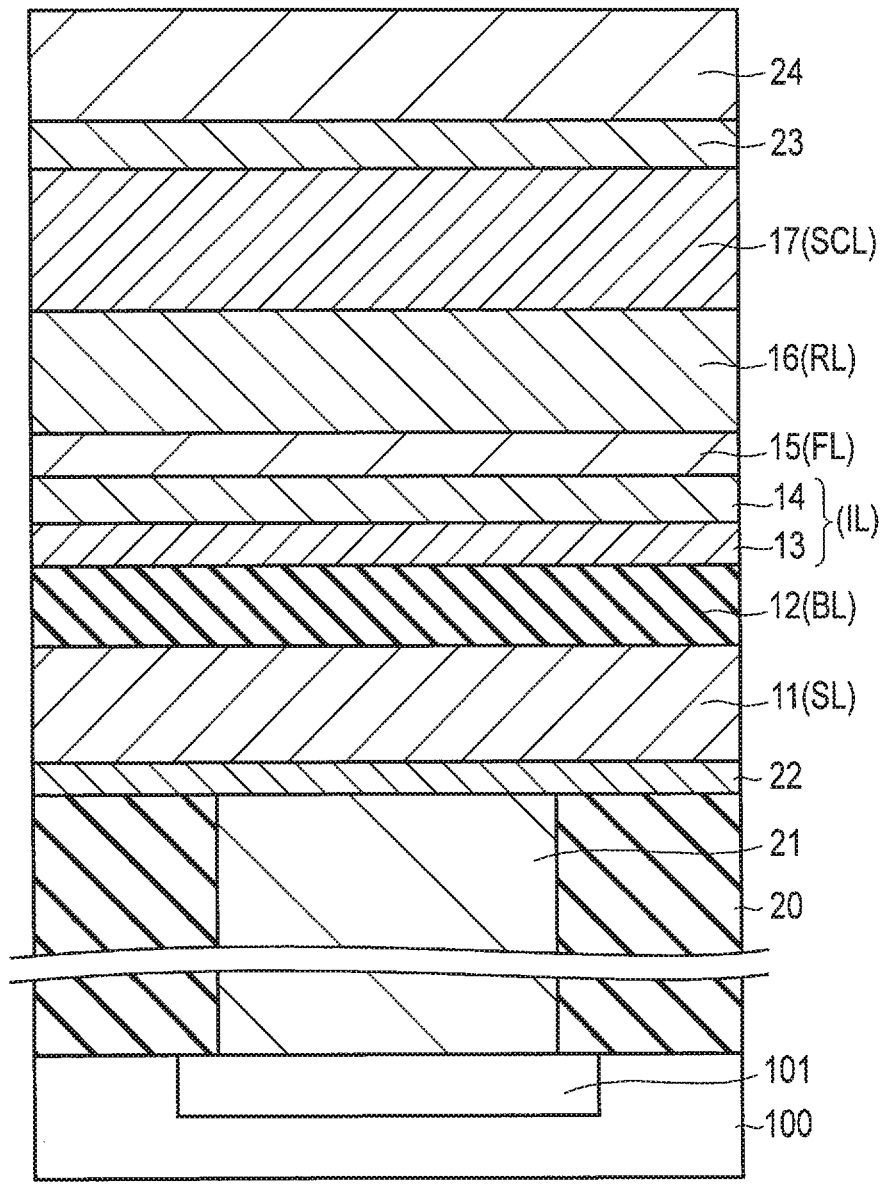
F I G. 6

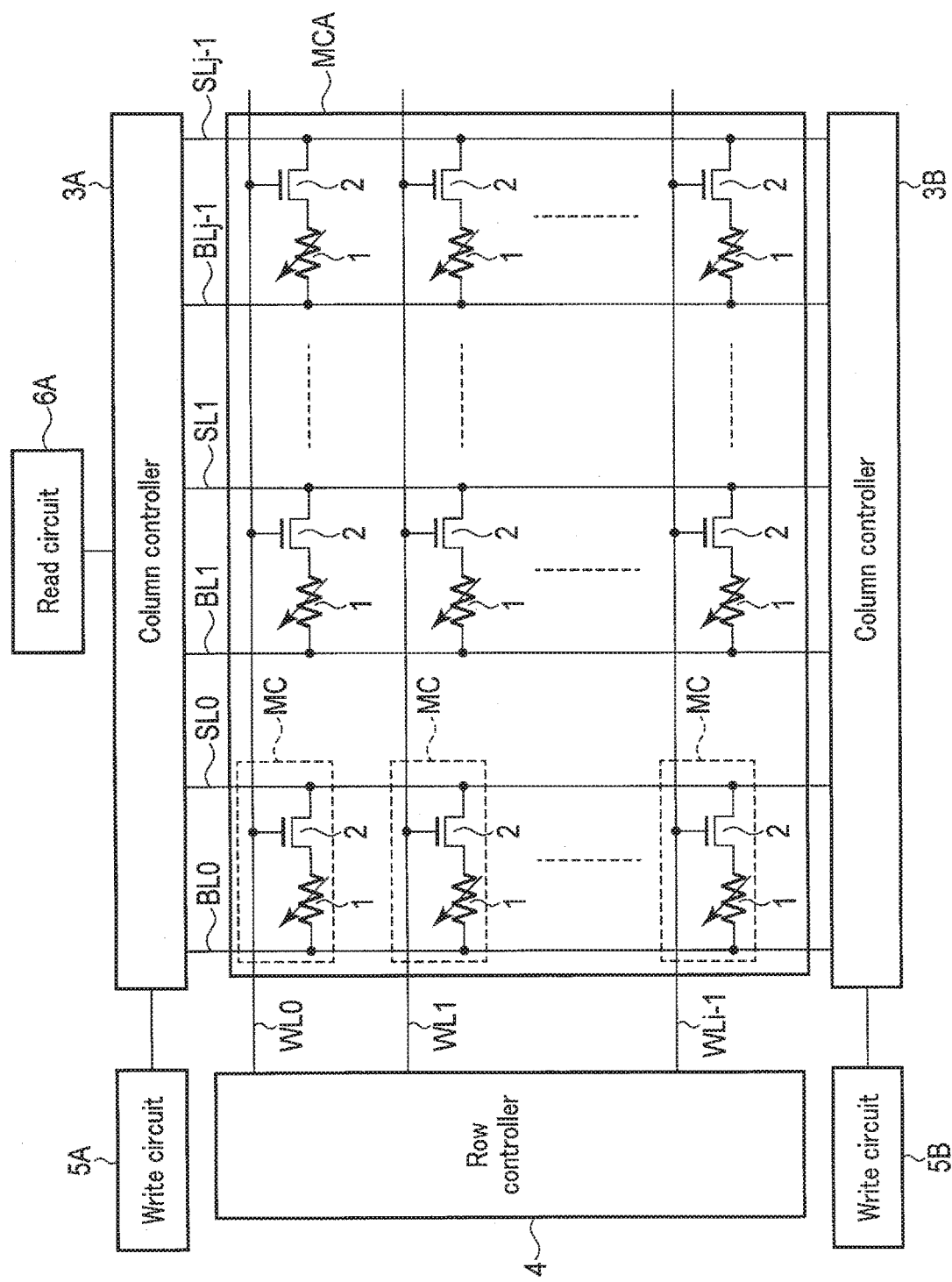
F I G. 12

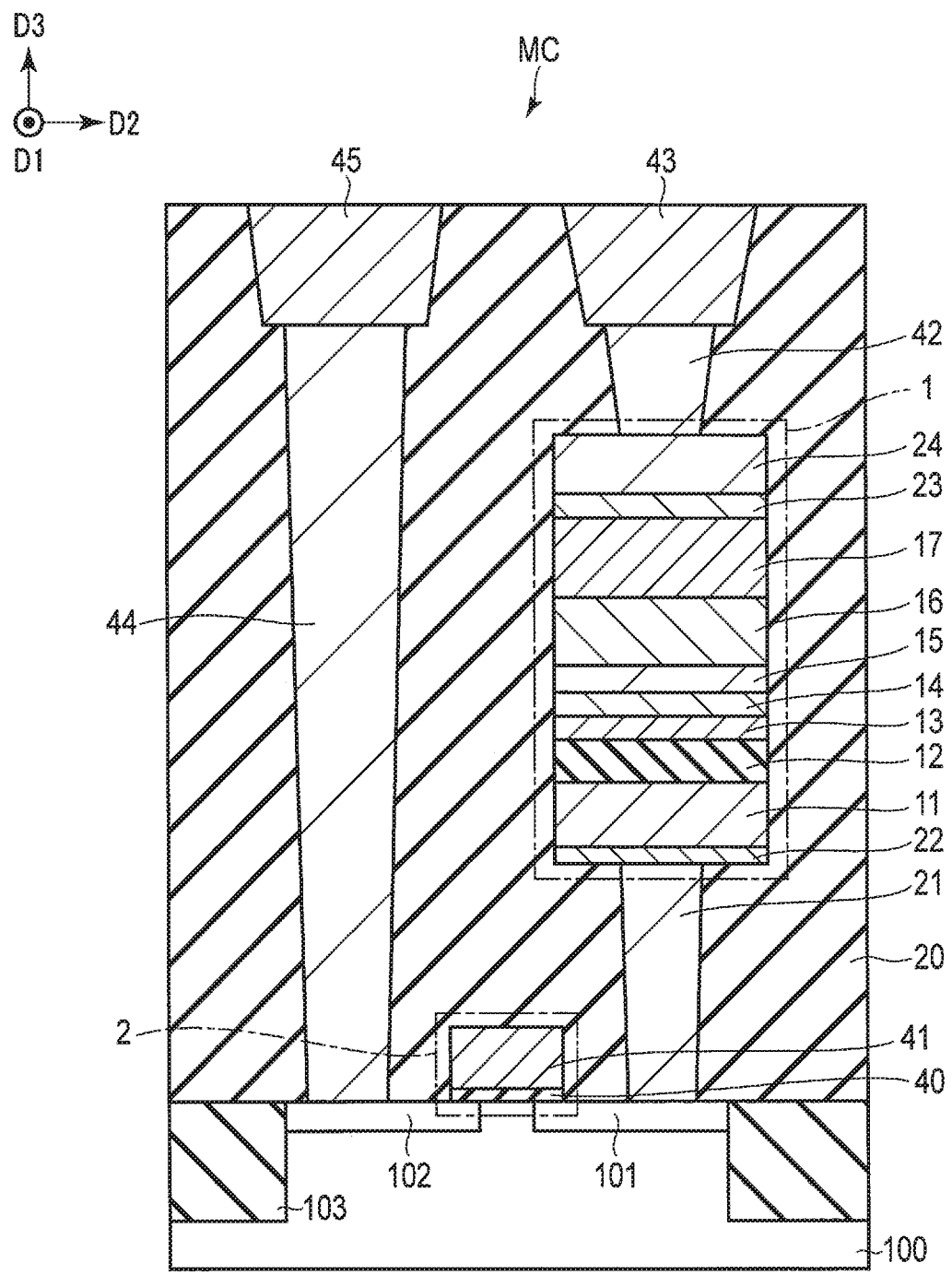
F I G. 13

MAGNETIC MEMORY DEVICE AND METHOD OF MANUFACTURING THE SAME

CROSS-REFERENCE TO RELATED APPLICATIONS

This application is based upon and claims the benefit of priority from Japanese Patent Application. No. 2017-054910, filed Mar. 21, 2017, the entire contents of which are incorporated herein by reference.

FIELD

Embodiments described herein relate generally to a magnetic memory device and a method of manufacturing the same.

BACKGROUND

As a type of magnetic memory device, a semiconductor memory device including a resistance change type memory is known. As a type of resistance change type memory, a magnetoresistive random access memory (MRAM) is known. An MRAM is a memory device employing a magnetic tunnel junction element (MTJ element) as a memory cell for storing information, and receives attention as a next-generation memory device characterized by its high-speed operation, large storage capacity, and non-volatility. Research and development have been conducted to use an MRAM as a replacement for a volatile memory, such as a DRAM or an SRAM.

BRIEF DESCRIPTION OF THE DRAWINGS

FIG. 1 is a graph showing the relationship between heat stability energy and a magnetization reversal current in a magnetic tunnel junction element;

FIG. 6 is a cross-sectional view showing a step of manufacturing the magnetic tunnel junction element of the magnetic memory device according to the first embodiment;

FIG. 12 is a block diagram of a magnetic memory device according to a third embodiment; and FIG. 13 is a cross-sectional view of a memory cell of the magnetic memory device according to the third embodiment.

DETAILED DESCRIPTION

Figure 2:
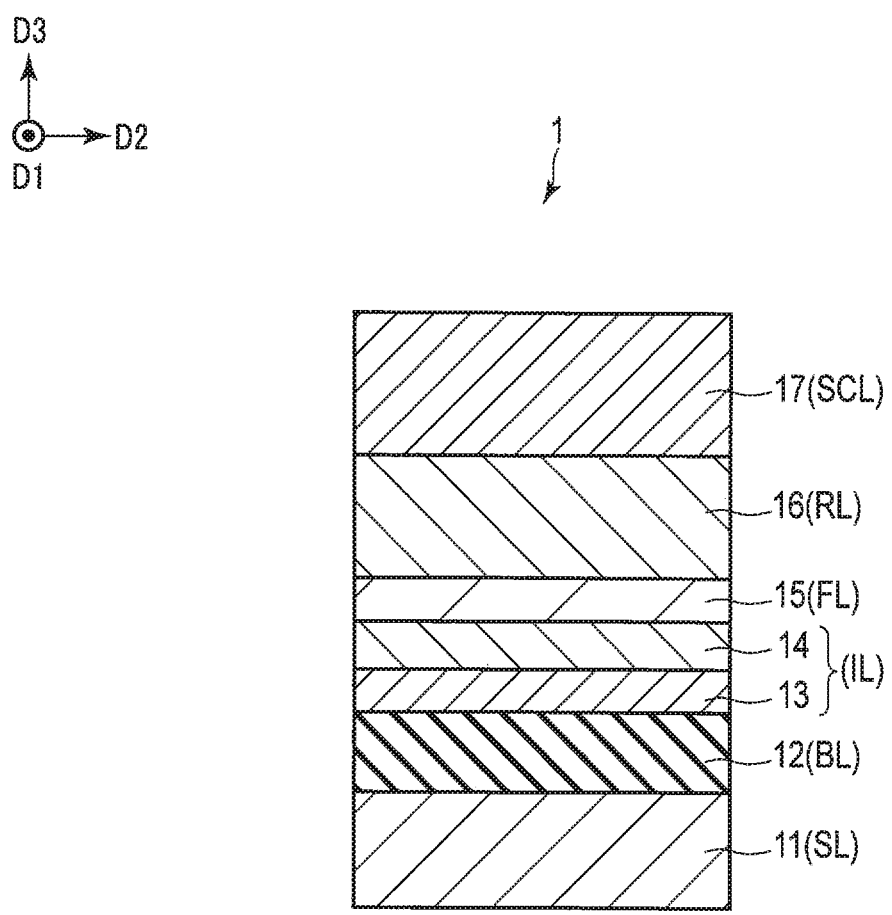
FIG. 2 is a cross-sectional view of a magnetic tunnel junction element of a magnetic memory device according to a first embodiment.

In general, according to one embodiment, a magnetic memory device includes a first magnetic layer having a variable magnetization direction, a first non-magnetic layer provided on the first magnetic layer, and a second magnetic layer provided on the first magnetic layer and having a fixed magnetization direction. The second magnetic layer includes a non-magnetic metal including at least one of No (molybdenum), Ta (tantalum), W (tungsten), Hf (hafnium), Nb (niobium), and Ti (titanium).

1. First Embodiment

A magnetic memory device according the the first embodiment will be described. In the following description, an MRAM, which stores data by using a magnetic tunnel junction (MTJ) element, will be described as an example of the magnetic memory device. An MTJ element has two magnetic layers (a storage layer and a reference layer) and a tunnel barrier layer provided. therebetween as a basic configuration. The direction of the magnetization of the storage layer is variable, and that of the reference layer is invariable (fired).

When the direction of the magnetization of the storage layer is the same as that of the reference layer (when the MTJ element is in a magnetization parallel alignment condition), the MTJ element has a first resistance state (a first resistance value). When the direction of the magnetization of the storage layer is different from that of the reference layer (when the MTJ element is in a magnetization antiparallel alignment state), the MTJ element has a second resistance state (a second resistance value). The resistance value of the MTJ element 1 in the first resistance state is smaller than that in the second resistance state. Thus, the MTJ element can store data with the values "0" and "1" respectively corresponding to the first and second resistance states. The association of a resistance state of the MTJ element and data can be determined as desired.

In an MRAM, if a magnetic material with large saturation magnetization Ms (e.g., cobalt iron boron (CoFeB) or the same in a crystalline state) is used for a magnetic layer in the MTJ element, it is thereby difficult to suppress interference between adjacent memory cells and a leakage magnetic field from the reference layer to the storage layer as the MRAM is miniaturized. When lowering the saturation magnetization Ms of a magnetic material to suppress a leakage magnetic field, high magnetic stability with no failures (e.g., magnetization reversal) due to heat, an external magnetic field, and disturbance of a current flowing during a read or write operation, while maintaining a high magneto-resistance ratio (MR ratio), is demanded.

If the saturation magnetization Ms is lowered by introducing, for example, molybdenum. (Mo) as a non-magnetic material to a magnetic material (e.g., CoFeB), a magnetization reversal current Ic with respect to thermal stability energy $\Delta E$ is increased. FIG. 1 shows an example of introducing Mo to the storage layer of the MTJ element. As shown in FIG. 1, compared to a case where Mo is not introduced to the storage layer ("No Mo" in FIG. 1), a magnetization reversal current Ic with respect to heat stability energy $\Delta E$ is increased if Mo is added to a magnetic material used in the storage layer ("Mo added" in FIG. 1) or if an Mo layer is inserted into the storage layer ("Mo layer inserted" in. FIG. 1). If Mo is introduced to the storage layer, the magnetization reversal current Ic, that is, a data-write current tends to be increased. If Mo is introduced to the reference layer, the magnetization reversal current Ic of the reference layer is increased and magnetization reversal occurs less frequently; as a consequence, heat stability in the reference layer is improved.

If a non-magnetic material (e.g., Mo) is introduced to the reference layer, however, the artificial lattice of the reference layer is deformed and the magnetic anisotropy of the reference layer is lowered; as a consequence, the heat stability becomes unstable. Furthermore, if a non-magnetic material (e.g. , Mo) is mixed in the vicinity of the interface between the interface layer and the tunnel barrier layer (e.g., magnesium oxide (MgO)), the polarity rate of the magnetic substance is decreased and the MR ratio is lowered.

For these reasons, in the MTJ element of the magnetic memory device according to the present embodiment, an interface layer (e.g., CoFeB) having a magnetic coupling to the reference layer is provided between the reference layer and the tunnel barrier layer, and a non-magnetic material (e.g., Mo) is added to the interface layer in such a manner that the concentration increases from the tunnel barrier layer side toward the reference layer side. The MR ratio of the MTJ element is hardly reduced and the reference layer maintains high heat stability even when Ms of the reference layer is lowered by adding a non-magnetic material to the interface layer.

1.1 Configuration of MTJ Element

First, the configuration of the MTJ element 1 will be described. FIG. 2 is a cross-sectional view of the MTJ element 1.

As shown in FIG. 2, the MTJ element 1 is configured by three-dimensionally arranging a storage layer 11 ("SL" in FIG. 2), a tunnel barrier layer 12 ("BL" in FIG. 2), interface layers 13 and 14 ("IL" in FIG. 2), a function layer 15 ("FL" in FIG. 2), a reference layer 16 ("RL" in FIG. 2), and a shift cancel layer 17 ("SCL" in FIG. 2) from the bottom in the order mentioned.

The storage layer 11 is a magnetic layer having perpendicular magnetic anisotropy, for example. The direction of magnetization (magnetization direction) of the storage layer 11 is variable, and is nearly perpendicular to the layer surface (film surface). For the storage layer 11, CoFeB or iron boride (FeB) may he used, for example. An example of using CoFeB for the storage layer 11 will be described below.

The reference layer 16 and the shift cancel layer 17 are magnetic layers having perpendicular magnetic anisotropy, for example. The direction of magnetization of the reference layer 16 and the shift cancel layer 17 is invariable (fixed) and nearly perpendicular to the layer surface (film surface). The magnetization direction of the shift cancel layer 17 is set antiparallel to that of the reference layer 16 to adjust the magnetic field leaking from the reference layer 16 to the storage layer 11. In other words, the reference layer 16 and the shift cancel layer 17 are coupled in an antiferromagnetic manner.

For the reference layer 16 and the shift cancel layer 17, an artificial lattice film in which Co, platinum (Pt), Ni, or palladium (Pd) are laminated, or an alloy film made of Co, Pt, Ni, or Pd is used. More specifically, a film made by laminating a magnetic layer and a non-magnetic layer, such as Co/Ni, Co/Pt, and Co/Pd, may be used as an artificial lattice film, and cobalt platinum (CoPt), cobalt nickel (CoNi), or cobalt palladium (CoPd) may be used as an alloy film, for example. The reference layer 16 and the shift cancel layer 17 may have different configurations.

An intermediate layer (not shown) made of a non-magnetic material may be provided between the reference layer 16 and the shift cancel layer 17. The intermediate layer has a heat-resisting property for preventing thermal diffusion and a function of controlling a crystalline orientation of the reference layer 16 and the shift cancel layer 17. For the intermediate layer, Ru is used, for example. If the film thickness of the intermediate layer increases, the distance between the shift cancel layer 17 and the reference layer 16 becomes greater; as a consequence, the magnetic field applied from the shift cancel layer 17 to the reference layer 16 decreases. For this reason, the film thickness of the intermediate layer is preferably 5 nm or thinner; for example. The reference layer 16, the intermediate layer, and the shift cancel layer 17 may have a synthetic antiferromagnetic (SAF) structure.

The tunnel barrier layer 12 consists of an insulation film, and functions as a barrier between the storage layer 11 and the reference layer 16. For the tunnel barrier layer 12, magnesium oxide (MgO) or aluminum oxide ($Al_2O_3$) may be used, for example. Hereinafter, an example of using MgO for the tunnel barrier layer 12 will be described. Since the tunnel barrier layer 12 is an insulation layer, the storage layer 11 and the reference layer 16 will be out of conduction if the film thickness of the tunnel barrier layer 12 becomes too large; accordingly, the thickness is preferably approximately 1 nm or thinner.

The interface layers 13 and 14 have a magnetic coupling with the reference layer 16. The interface layers 13 and 14 are made of a material having a high polarization rate, for example, and the MTJ element 1 to which the interface layer 13 is introduced can achieve a large tunneling magneto resistive (TMR) effect. For the interface layers 13 and 14, a material with small lattice mismatch with the tunnel barrier layer 12 is preferable. For the interface layers 13 and 14, CoFeB or FeB may be used, for example. Hereinafter, an example of using CoFeB for the interface layer 13 will be described. The interface layer 14 is a layer to which a non-magnetic material (e.g., Mo, tantalum (Ta), tungsten (W), hafnium (Hf), niobium (Nb), or titanium (Ti)) is added to the interface layer 13 to lower the saturation magnetization Ms. Although the effect of lowering Ms can be achieved with any of Mo, Ta, W, Hf, Nb, and Ti, the heat stability energy $\Delta E$ is significantly improved if Mo is added. In the present embodiment, an example of adding Mo to CoFeB as the interface layer 14 will be described. The concentration of Mo in the interface layer 14 is preferably 10 atomic % or lower, as the magnetization disappears when the concentration of Mo becomes high. The film thickness of the interface layer 13 and the interface layer 14 altogether is preferably approximately 1 to 2 nm.

The film composition of the interface layer 14 is not necessarily uniform from the interface with the interface layer 13 to the interface with the function layer 15. The concentration of Mo in the interface layer 14 may be gradually increased from the interface with the interface layer 13 toward the interface with the function layer 15, and may become the highest in the central vicinity of the interface layer 14. In the present embodiment, a case where the concentration of Mo in the interface layer 14 is gradually increased from the interface with the interface layer 13 toward the interface with the function layer 15 will be described. In this case, since the concentration of Mo is gradually increased from the interface with the interface layer 13 toward the interface with the function layer 15, the interface between the interface layer 13 and the interface layer 14 does not have to be definite Tn other words, the interface layers 13 and 14 may be considered as a region 13 where a non-magnetic material is not included and a region 14 where a non-magnetic material is included in the interface layer.

The concentration distribution of Mo can be checked by energy dispersive X-ray spectroscopy (EDX) mapping or electron energy loss spectroscopy (EELS) mapping of the cross section of the MTJ element 1.

The function layer 15 prevents a metallic element from diffusing between the reference layer 16 and the interface layers 13 and 14. For the function layer 15, a film made of a non-magnetic material, namely, Ta, Zr, W, Hf, Mo, Nb, Ti, Cr, or V, or a nitride or a carbon compound thereof may be used. Hereinafter, an example of using Ta for the function layer 15 will be described. The function of preventing diffusion is decreased as the film thickness of the function layer 15 decreases, and the magnetic coupling between the interface layers 13 and 14 and the reference layer 16 becomes weak as the film thickness increases; accordingly, the thickness is preferably in the order of 1 nm.

The interface layers 13 and 14 have a magnetic coupling with the reference layer 16. For this reason, a layer including the interface layers 13 and 14, the function layer 15, and the reference layer 16 functions as one reference layer. Thus, the interface layers 13 and 14, the function layer 15, and the reference layer 16 may be collectively called one reference layer. In this case, the interface layers 13 and 14 may be collectively called a first magnetic region, and the reference layer 16 may be called a second magnetic region.

Furthermore, in FIG. 2, the shift cancel layer 17, the reference layer 16, the function layer 15, the interface layer 14, the interface layer 13, the tunnel barrier layer 12, and the storage layer 11 may be three-dimensionally arranged in the MTJ element 1, from the bottom to the top in this order. In other words, in the MTJ element 1, the storage layer 11 may be arranged on the reference layer 16 with the tunnel barrier layer 12 being interposed therebetween.

The cross-sectional shape of the MTJ element 1 can be freely determined. The shape may be a rectangular parllelepiped, a trapezoid having an upper base shorter than the bottom base, or a shape with steps of layers, depending on the etching characteristics of the MTJ element 1.

Furthermore, the film thickness of each of the layers of the MTJ element 1 can be determined as appropriate.

1.2 Method of Manufacturing MTJ Element

Next, a method of manufacturing the MTJ element 1 will be described. FIG. 3 to FIG. 7 are cross-sectional views of the MTJ element 1, illustrating the steps of manufacturing the MTJ element 1. For simplification of the description, description of photolithography will be omitted in the description hereinafter.

Figure 3:
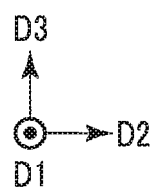
FIG. 3 is a cross-sectional view showing a step of manufacturing the magnetic tunnel junction element of the magnetic memory device according to the first embodiment.
Figure 3:
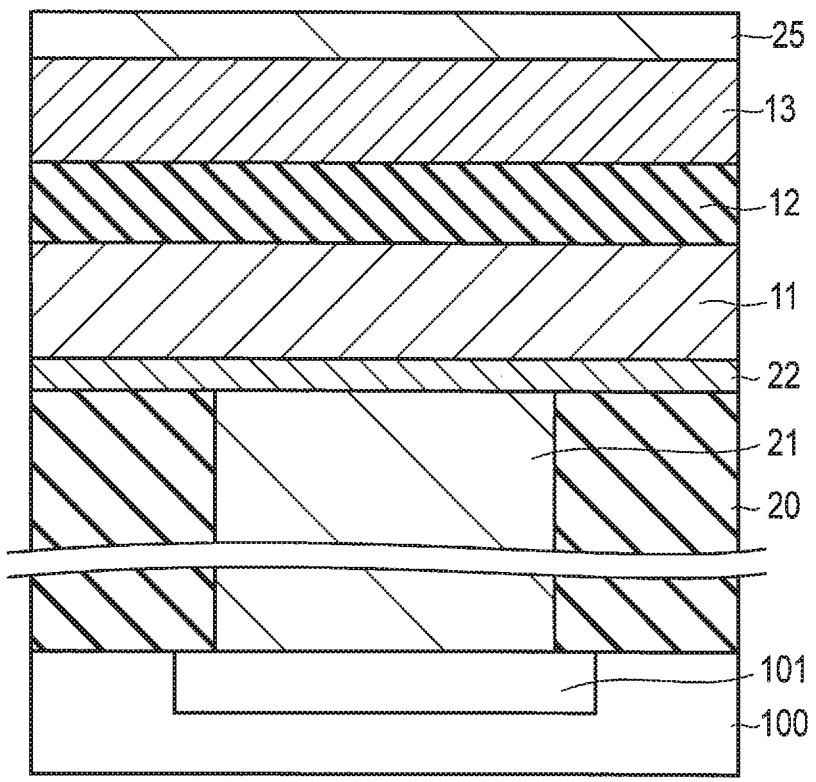

As shown in FIG. 3, a diffusion layer 101 is first formed on the semiconductor substrate 100, and an insolation layer 20 is then formed on the semiconductor substrate 100. For the insulation layer 20, a silicon oxide film ($SiO_2$) is used, for example. The insulation layer 20 may be a single-layered film or a multi-layered film.

Next, a bottom electrode plug (hereinafter, "BEG plug") 21 that reaches the diffusion layer 101 is formed in the insulation layer 20. For example, tungsten (W) is used for the BEC plug 21. As a barrier metal covering the bottom and the side of W, a film of tantalum (Ta), titanium (Ti), titanium nitride (TiN), or tantalum nitride (TaN), or a multi-layered film thereof is used, for example.

Next, a base layer 22, a storage layer 11, a tunnel barrier layer 12, an interface layer 13, and a non-magnetic layer 25 are three-dimensionally arranged in this order on the insulation layer 20 and the FEC plug 21 by, for example, sputtering. To encourage crystallization of MgO/CoFeB, the non-magnetic layer 25 may be formed by sputtering after forming the interface layer 13 by sputtering and performing annealing processing.

The base layer 22 electrically couples the storage layer 11 to the BEC plug 21. The base layer 22 may be a nitride or an oxide, such as MgO, magnesium nitride (MgN), zirconium nitride (ZrN), niobium nitride (NbN), silicon nitride (SiN) aluminum nitride (AlN), hafnium nitride (HfN), tantalum nitride (TaN), tungsten nitride (WN), chromium nitride (CrN), molybdenum nitride (MoN), titanium nitride (TIN), or vanadium nitride (VN). Furthermore, the base layer 22 may be a nitride or an oxide including two of Mg, Zr, Nb, Si, Al, Hf, Ta, W, Cr, Mo, Ti and V. In other words, the base layer 22 may not necessarily be a binary compound consisting of two elements but may be a ternary compound consisting of three elements, such as titanium aluminum nitride (AlTiN). A nitride and an oxide suppress increase of a damping constant of a magnetic layer in contact with these compounds, and can achieve an effect of reducing a write current. Furthermore, by using a nitride or an oxygen compound which is a high-melting metal, it is possible to suppress diffusion of a material of the base layer to a magnetic layer and to suppress degradation of an MR ratio. Herein, a high-melting metal is a material having a melting point higher than that of Fe and Co, and is, for example, Zr, Hf, W, Mo, Nb, Ti, Ta, and V, and an alloy thereof.

Mo, which is added to the interface layer 14, is used for the non-magnetic layer 25.

In the interface layer 13, Mo of the non-magnetic layer 25 is implanted by post-processing, such as IBE (ion beam etching), and the interface layer 14 is formed in the surface vicinity of the interface layer 13. The surface of the interface layer 13 is partially etched by IBE. For this reason, the thickness of the interface layer 13, which is formed by, for example, sputtering, is made thicker than a thickness necessary for the interface layer 13 and the interface layer 14.

Figure 4:
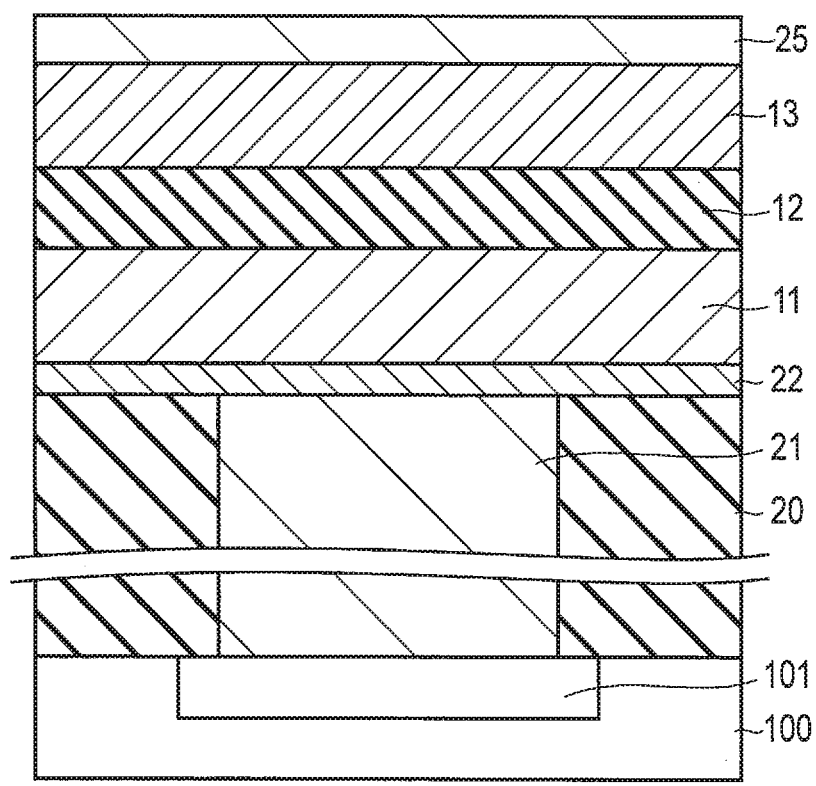
FIG. 4 is a cross-sectional view showing a step of manufacturing the magnetic tunnel junction element of the magnetic memory device according to the first embodiment.

Next, as shown in FIG. 4, the non-magnetic layer 25 and a part of the surface of the interface layer 13 is removed by a physical processing method, such as IBE. An inert gas, such as argon (Ar) and neon (Ne), is used for IBE. The example illustrated in FIG. 4 shows a case of using an argon gas. When etching is performed on the non-magnetic layer 25, a part of the non-magnetic layer 25 (Mo) is implanted in the vicinity of the surface of the interface layer 13 by the ion beam of Ar (hereinafter, referred to as "knocking effect").

Figure 5:
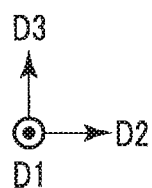
FIG. 5 is a cross-sectional view showing a step of manufacturing the magnetic tunnel junction element of the magnetic memory device according to the first embodiment.
Figure 5:
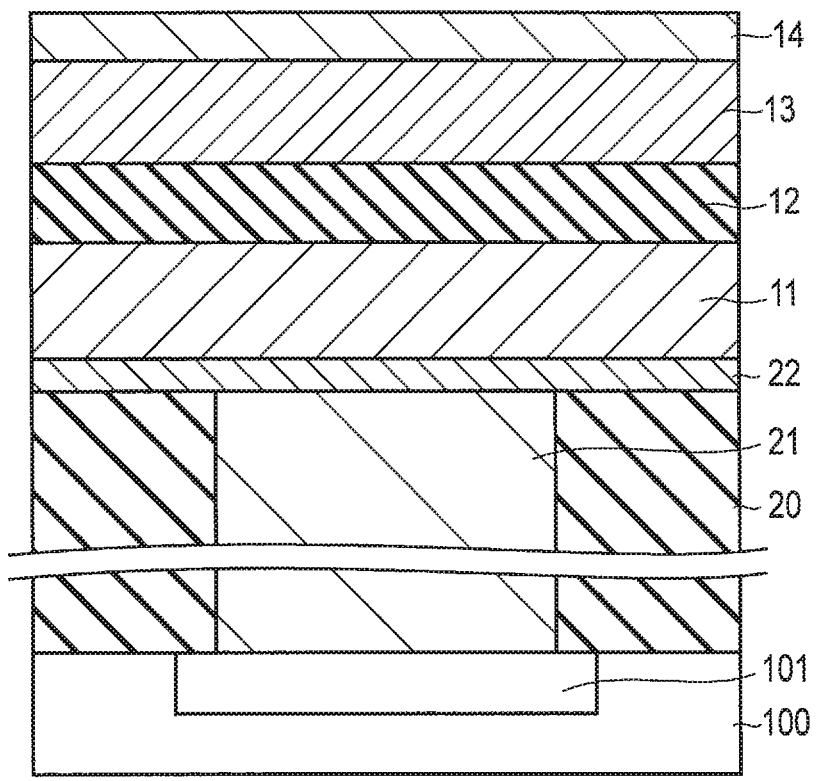

As a result, the interface layer 14 is formed in the vicinity of the surface of the interface layer 13 as shown in FIG. 5. Since Mo in the interface layer 14 is added by implantation (knocking effect), the concentration increases toward the surface (the direction away from the interface with the interface layer 13).

Next, as shown in FIG. 6, a function layer 15, a reference layer 16, a shift cancel layer 17, a cap layer 23, and a hard mask layer 24 are three-dimensionally arranged on the interface layer 14 by, for example, sputtering.

The cap layer 23 suppresses a response of the shift cancel layer 17 and the hard mask layer 24. The cap layer 23 may include Pt, W, Ta, Ru.

A metal film may he used for the hard mask layer 24, for example. The hard mask layer 24 serves as not only an electrode hut also a mask for patterning the MTJ element 1. Consequently, for the hard mask layer 24, a material having low electric resistance and excellent diffusion resistance and also having excellent etching resistance or milling resistance is desirable. For The hard mask layer 24, a single-layer film of t, Ta, TaN, Ti, or TiN, etc., or a multi-layered film including any of these films may be used, for example. For the hard mask layer 24, an insulation material, such as $SiO_2$ or SiN, may be used. In this case, a top electrode plug (hereinafter, "TEC plug") provided on the hard mask layer 24 penetrates the hard mask layer 24, and its bottom is formed so as to be in contact with the cap layer 23.

Figure 7:
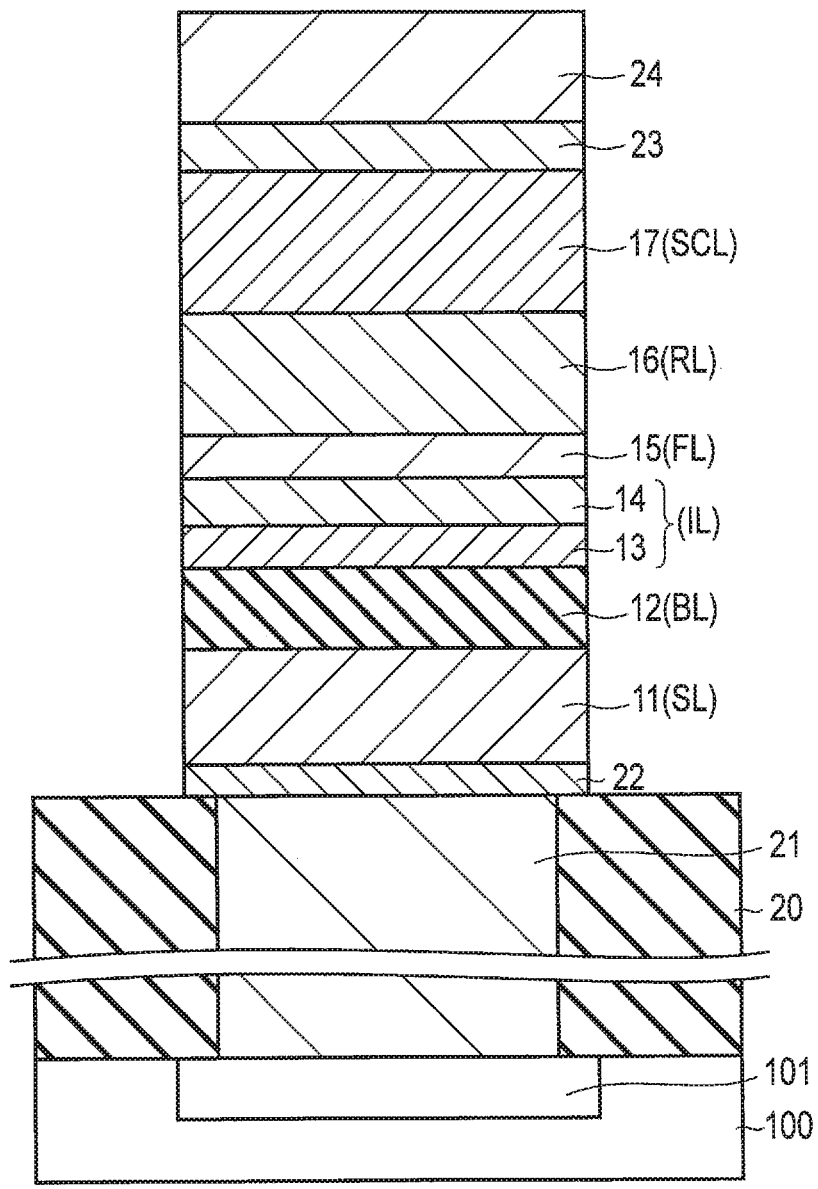
FIG. 7 is a cross-sectional view showing a step of manufacturing the magnetic tunnel junction element of the magnetic memory device according to the first embodiment.

Next, as shown in FIG. 7, the layers, from the hard mask layer 24 to the base layer 22, are processed by IBE or RIE (reactive ion etching), for example, to form the MTJ element 1.

In the present embodiment, a case where Mo is implanted in the vicinity of the surface of the interface layer 13 to form the interface layer 14 is explained but the embodiment is not limited thereto. For example, the interface layer 14 may be formed by sputtering, using a sputtering target of Mo-added CoFeB. In this case, the distribution of the concentration of Mo in the interface layer 14 is uniform.

A buffer layer may be further provided on the interface between the BEC plug 21 and the base layer 22. The buffer layer includes Al, beryllium (Be), Mg, calcium (Ca), strontium (Sr), barium (Ba), scandium (Sc), yttrium (Y), lanthanum (La), Si, Zr, Hf, W, Cr, Mo, Nb, Ti, Ta, or V. The buffer layer may include a boron compound of any of those materials. A boron compound may not necessarily be a-binary compound consisting of two elements but may be a ternary compound consisting of three elements. In other words, the buffer layer may include a mixture of binary compounds. For example, the buffer layer may be made of hafnium boride (HfB), magnesium aluminum boride (MgAlB), hafnium aluminum boride (HfAlB) scandium aluminum boride (ScAlB), scandium hafnium boride (ScHfB), or hafnium magnesium boride (HfMgB). These materials may be laminated. By using a metal with a high melting point and a boride thereof, it is possible to suppress diffusion of a material of the buffer layer to a magnetic layer and suppress degradation of an MR ratio.

1.3 Distribution of Molybdenum in the Vicinity of Interface Layer

Figure 8:
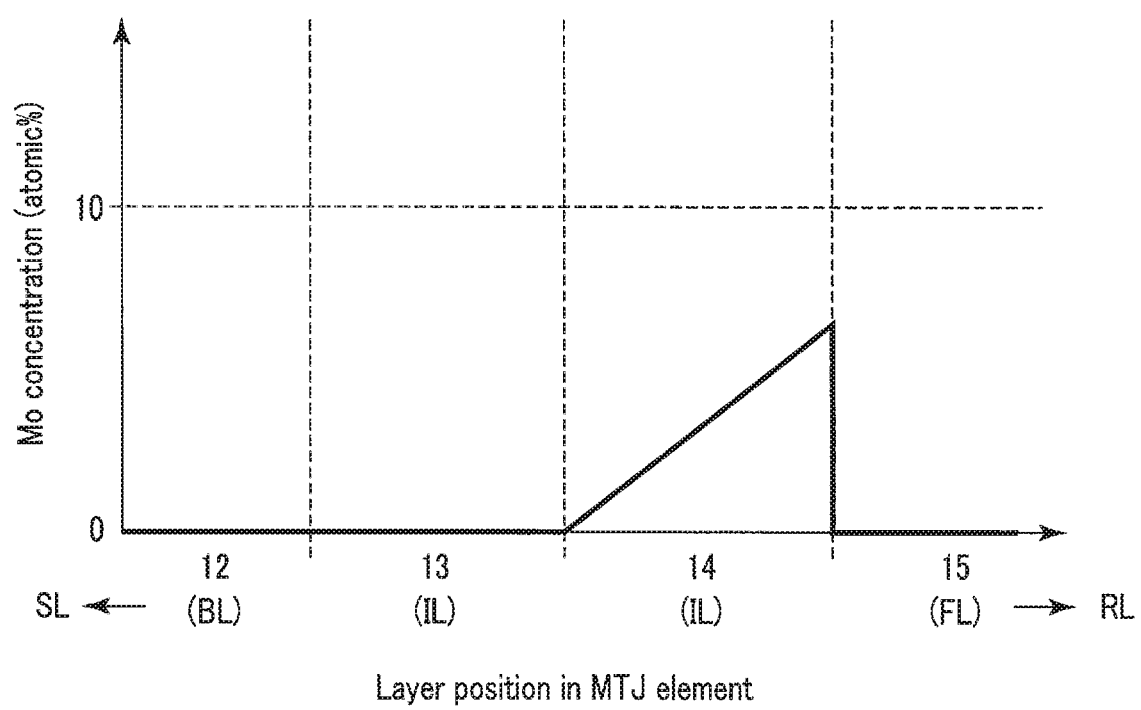
FIG. 8 is a graph showing concentration distribution of Mo in the magnetic tunnel junction element of the magnetic memory device according to the first embodiment.

Next, the distribution of Molybdenum (Mo) in the vicinity of the interface layer will be described. FIG. 8 is a graph showing a distribution of the concentration of Mo in the tunnel barrier layer 12, the interface layers 13 and 14, and the function layer 15. The example illustrated in FIG. 8 shows, in the manufacturing steps shown in FIG. 3 to FIG. 7, a case where MgO is used for the tunnel barrier layer 12, CoFeB is used for the interface layer 13, Mo-added CoFeB is used for the interface layer 14, and Ta is used for the function layer 15.

As shown in FIG. 8, there is almost no Mo in the vicinity of the interface between the tunnel barrier layer 12 and the interface layer 13, and in the interface layer 13 (or the concentration is lower than a minimum limit of detection). The concentration of Mo in the interface layer 14 is gradually increased from the interface with the interface layer 13 toward the interface with the function layer 15. It should be noted, however, that the concentration of Mo does not exceed 10 atomic % in the interface between the interface layer 14 and the function layer 15.

1.4 Advantageous Effects of Present Embodiment

The configuration according to the present embodiment can improve reliability of the magnetic memory device. Hereinafter, this advantage will be described in detail.

The configuration according to the present embodiment includes the interface layers 13 and 14 between the tunnel barrier layer 12 and the function layer 15 (reference layer 16) of the MTJ element 1. A non-magnetic material (e.g., Mo, Ta, W, Hf, Nb, or Ti) is added to the interface layer 14 to bring about a concentration gradient in such a manner that the concentration of the non-magnetic material is increased from the interface with the interface layer 13 toward the interface with the function layer 15. By introducing a non-magnetic material to the interface layer 14, the saturation magnetization Ms in the reference layer 16 can be lowered, and the heat stability of the reference layer 16 can be improved. Since a non-magnetic material is not introduced to the reference layer 16 in the configuration according to the present embodiment, the artificial lattice of the reference layer 16 does not get deformed. Furthermore, the non-magnetic material is prevented from being mixed into the tunnel barrier layer 12. For these reasons, the polarity rate of the magnetic substance is rarely decreased and the MR ratio is also rarely decreased. Thus, when compared with a case where no non-magnetic material is introduced to the interface layer, an MTJ element 1 having a lower saturation magnetization Ms and including a reference layer 16 having high heat stability can be formed with almost no decrease in the MR ratio. The reliability of the MTJ element 1 can be thus improved, and the reliability of the magnetic memory device can be improved.

Furthermore, by lowering the saturation magnetization Ms in the reference layer 16, it is possible to suppress interference between adjacent memory cells, and a leakage magnetic field from a reference layer to a storage layer when an MRAM is miniaturized.

The same material as that of the non-magnetic material added to the interface layer 14 (e.g., Mo) may be used for the function layer 15.

2. Second Embodiment

Next, a magnetic memory device according to the second embodiment is described. In the second embodiment, four examples of a case where a non-magnetic layer (e.g., an Mo layer) is inserted into an interface layer of the MTJ element 1 will be described. Hereinafter, only aspects different from the first embodiment will be described.

2.1 First Example

Figure 9:
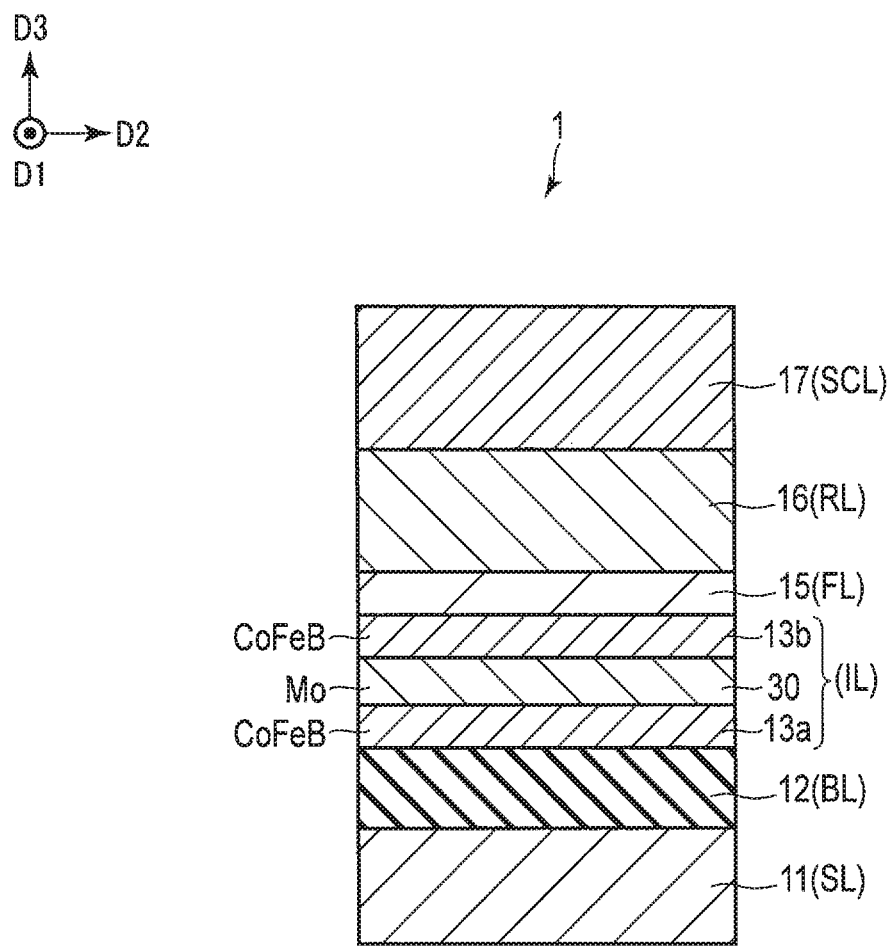
FIG. 9 is a cross-sectional view of a magnetic tunnel junction element of a magnetic memory device according to a first example of a second embodiment.

First of all, a first example of the second embodiment will be explained. In the first example, a case of inserting one non-magnetic layer into an interface layer will be explained. FIG. 9 is a cross-sectional view of a MTJ element 1 of a magnetic memory device according to the first example of the second embodiment.

As shown in FIG. 9, in the MTJ element 1, a storage layer 11, a tunnel barrier layer 12, three interface layers (13*a*, 30, and 13*b* from the bottom in this order), a function layer 15, a reference layer 16, and a shift cancel layer 17 are three-dimensionally arranged from the bottom in the order mentioned. The interface layers 13*a* and 13*b* are magnetic layers, and the interface layer 30 is a non-magnetic layer.

The same magnetic material as that used for the interface layer 13 in the first embodiment is used for the interface layers 13*a* and 13*b*. The example illustrated in FIG. 9 shows a case of using CoFeB for the interface layers 13*a* and 13*b*. Different materials having different composition ratios may be used for the interface layer 13*a* and the interface layer 13*b*.

A non-magnetic material (e.g., Mo, Ta, W, Hf, Nb, or Ti) may be used for the interface layer 30. The example illustrated in FIG. 9 shows a case of using Mo for the interface layer 30. The effect of lowering Ms can be achieved by inserting even only one atomic layer as the interface layer 30, i.e., an Mo layer.

If the film thickness of the interface layer 30 increases, the magnetic coupling between the interface layer 13a and the reference layer 16 becomes weak. Accordingly, the film thickness of the interface layer 30 is preferably between a few angstroms and 1 nm.

2.2 Second Example

Figure 10:
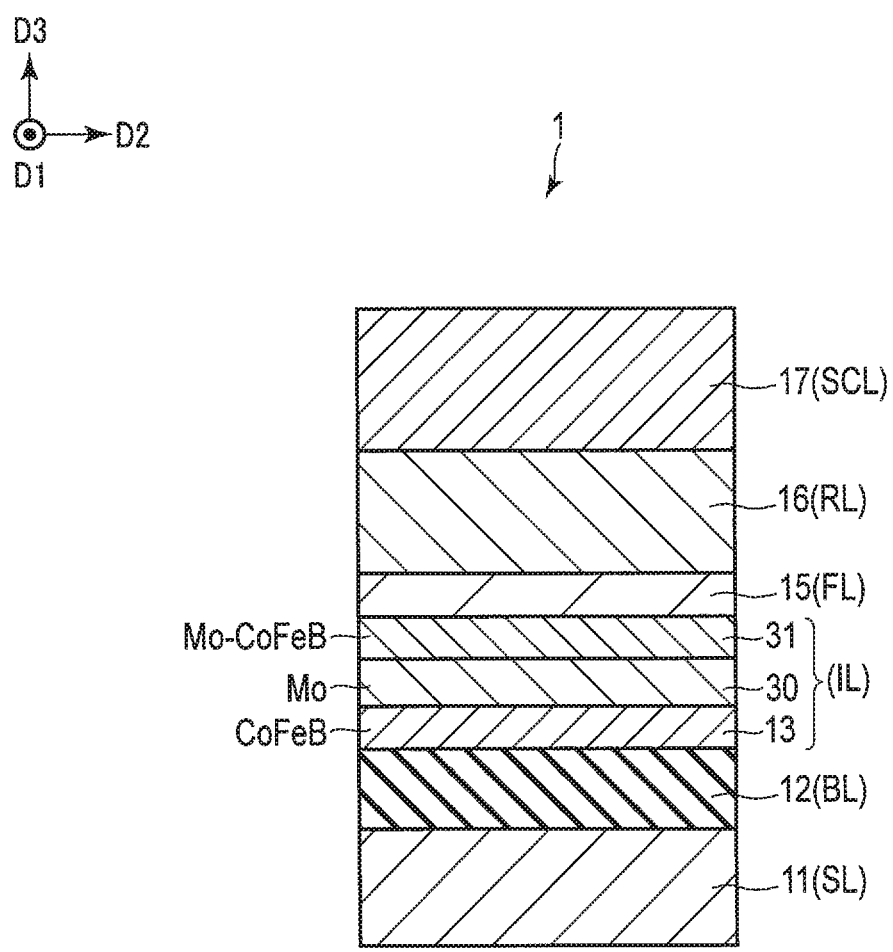
FIG. 10 is a cross-sectional view of a magnetic tunnel junction element of a magnetic memory device according to a second example of the second embodiment.

Next, a second example will be described. In the second example, a case of three-dimensionally arranging a magnetic layer to which a non-magnetic material is added on the interface layer 30 (non-magnetic layer) will be described. FIG. 10 is a cross-sectional view of a MTJ element 1 of a magnetic memory device according to the second example of the second embodiment As shown in FIG. 10, in the MTJ element 1, a storage layer 11, a tunnel barrier layer 12, three interface layers (13, 30, and 31 from the bottom to the top), a function layer 15, a reference layer 16, and a shift cancel layer 17 are three-dimensionally arranged from the bottom in the order mentioned. The interface layers 13 and 31 are magnetic layers, and the interface layer 30 is a non-magnetic layer.

A magnetic material to which a non-magnetic material is added is used for the interface layer 31. The example illustrated in FIG. 10 shows a case of using an Mo-added CoFeB layer for the interface layer 31.

2.3 Third Example

Figure 11:
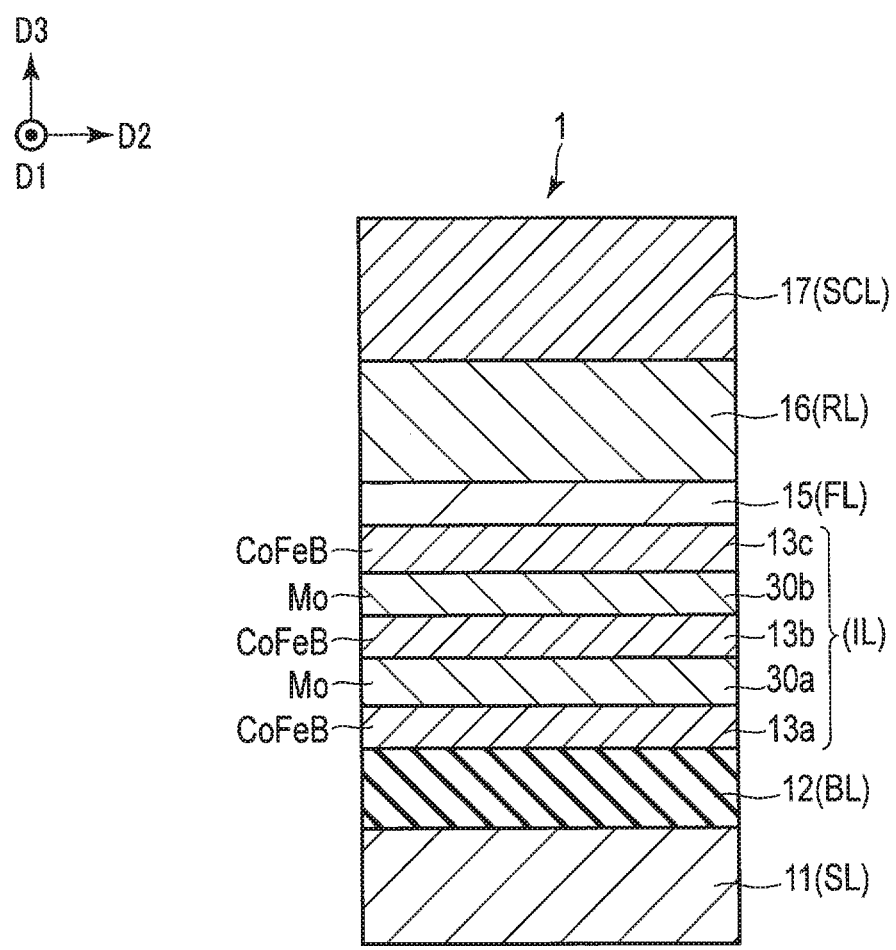
FIG. 11 is a cross-sectional view of a magnetic tunnel junction element of a magnetic memory device according to a third example of the second embodiment.

Next, a third example will be described. In the third example, two non-magnetic layers are inserted into an interface layer. FIG. 11 is a cross-sectional view of a MTJ element 1 of a magnetic memory device according to the third example of the second embodiment.

As shown in FIG. 11, in the MTJ element 1, a storage layer 11, a tunnel barrier layer 12, five interface layers (13a, 30a, 13b, 30b, and 13c from the bottom in this order), a function layer 15, a reference layer 16, and a shift cancel layer 17 are three-dimensionally arranged from the bottom in the order mentioned. The interface layers 13a, 13b, and 13c are magnetic layers, and the interface layers 30a and 30b are non-magnetic layers.

The same magnetic material as that used for the interface layer 13 in the first embodiment is used for the interface layers 13a to 13c. The example illustrated in FIG. 11 shows a case of using CoFeE for the interface layers 13a to 13c. Different materials having different composition ratios may be used for the interface layers 13a to 13c.

The same non-magnetic material (e.g., Mo, Ta, W, Hf, Nb, or Ti) as the material used in the first example is used for the interface layers 30a and 30b. The example illustrated in FIG. 11 shows a case of using Mo for the interface layers 30a and 30b.

The example illustrated in FIG. 11 shows a case of inserting two non-magnetic layers into the interface layer; however, three or more layers may be inserted.

2.4 Fourth Example

Next, a fourth example will be described. In the fourth example, in the configuration, which is the same as that in the first to third examples (FIGS. 9 to 11), the same material as the non-magnetic material (e.g., Mo) included in the interface layers 30a and 30b or the interface layer 31 may be used for the function layer 15.

2.5 Advantageous Effects according to Present Embodiment

The configuration of the present embodiment achieves advantageous effects similar to those achieved by the first embodiment Furthermore, the configuration of the third example of the present embodiment can make the thickness of the non-magnetic layer thinner per layer by inserting a multi-layered non-magnetic layer (e.g., an Mo layer) into an interface layer.

Thus, it is possible to suppress a decrease of a magnetic coupling between the upper layer and the lower layer in the interface layer it is possible to suppress a degradation of the MR ratio.

In the first to third examples, instead of inserting non-magnetic layers (30, 30a, and 30b) into an interface layer, a magnetic layer 31 to which a non-magnetic material is added (e.g., an Mo-added CoFeB layer) may be inserted.

3. Third Embodiment

Next, a magnetic memory device according to the third embodiment is described. In the third embodiment, an MRAM using the MTJ element 1 as described in the first embodiment is described.

3.1 Overall Configuration of MRAM

First of all, an overall configuration of an MRAM will be explained. FIG. 12 is a block diagram showing an MRAM.

As shown in FIG. 12, an MEAN includes a memory cell array MCA, column controllers 3A and 3B, a row controller 4, write circuits 5A and 5B, and a read circuit 6A.

The memory cell array MCA comprises a matrix of a plurality of memory cells MC. In the memory cell array MCA, a plurality of word lines WLn (n is an integer between 0 and (i-1)), plurality of bit lines BLm (m is an integer between 0 and (j -1)) and a plurality of source lines SLm (m is an integer between 0 and (j-1)) are arranged.

The extending direction of the bit line BLm and source line SLm is defined as a column direction, and the extending direction of the word line WLn, which is nearly orthogonal to the column direction, is defined as a row direction in FIG. 12, the bit line BLm and the source line SLm extend in the column direction, and the word line WLn extends in the row direction; however, the arrangement of the lines is not limited to this, and the example herein may be changed as appropriate.

Each memory cell MC is coupled to the bit line BLm, the source line SLm, and the word line WLn. Memory cells MC aligned in the column direction are coupled to a common bit line BLm, and a common source line SLm. Memory cells MC aligned in the row direction are coupled to a common word line WLn.

Each memory cell MC includes an MTJ element 1 and a selection transistor 2. The selection transistor 2 is an n-channel metal oxide semiconductor field effect transistor (MOSFET), for example.

One end of the MTJ element 1 (e.g., a hard mask layer 24) is coupled to a bit line BLm, and the other end (e.g., a BEC plug 21) is coupled to the drain (source) of the selection transistor 2. The gate of the selection transistor 2 is coupled to a word line WLn, and the source (drain) thereof is coupled to a source line SLm.

One end of the word line WLn is coupled to the row controller 4. The row controller 4 controls selection/un-selection of the word line WLn based on an address signal externally input.

One end and the other end of each of the bit line BLm and the source line SLm are coupled to the column controllers 3A and 3B, respectively. The column controllers 3A and 3B control selection/un-selection of the bit line BLm and the source line SLm based on an address signal externally input.

The write circuits 5A and 5B are coupled respectively to one end and the other end of each of the bit line BLm and the source line SLm via the column controllers 3A and 3B.

The write circuits 5A and 5B each include a source circuit, such as a current source or voltage source, for generating a write current, and a sink circuit for absorbing the write current.

When data is written, the write circuits 5A and 5B supply a write current to a memory cell externally selected. (hereinafter referred to as "selected cell").

When data is written in an MTJ element 1 in a memory cell MC, the write circuits 5A and 5B output a write current to pass through the MTJ element 1 in either direction in accordance with data written in the selected cell. Namely, the write circuits 5A and 5B output a write current that flows from the bit line BLm to the source line SL or a write current that flows from the source line SLm to the bit line BLm in accordance with data written in the MTJ element 1.

The read circuit 6A is coupled to one and the other ends of each of the bit line BLm and the source line SLm via the column controllers 3A and 3B. The read circuit 6A includes, for example, a voltage source or current source for generating a read current, a sense amplifier that senses and amplifies a read signal, and a latch circuit that temporarily holds data. When data is read from the MTJ element 1, the read circuit 6A supplies a read current to the selected cell. The current value of the read current is smaller than the current value of the write current. (magnetization reversal threshold value) so that the read current does not reverse the magnetization of a storage layer 11.

The current value or electrical potential at the read node varies depending on the resistance value of the MTJ element supplied with the read current. Data stored in the MTJ element 1 is distinguished based on the variation of the current value or electrical potential (read signal, read output) corresponding to the resistance value of the MTJ element 1.

In the example shown in FIG. 12, the read circuit 6A is provided on one end side of the column direction; however, two read circuits may be provided respectively on one end side and the other end side of the column direction.

3.2 Cross-Sectional Configuration of Memory Cell

Next, a cross-sectional configuration of a memory cell will he described. FIG. 13 is a cross-sectional view of the memory cell MC using the MTJ element 1 described in the first embodiment. The example illustrated in. FIG. 13 is a case of forming the selection transistor 2 on the semiconductor substrate 100; however, the selection transistor 2 may adopt a buried gate structure in which the gate insulation film 40 and gate electrode 41 of the selection transistor 2 are buried in the semiconductor substrate 100.

As shown in FIG. 13, an isolation region 103 is provided in the semiconductor substrate 100, and an active area which is separated from the isolation region 103 is provided (in other words, the periphery of the active area is surrounded by the isolation region 103). For example, $SiO_2$ is used for the isolation region 103. The diffusion layers 101 and 102, which function as a source or drain of the selection transistor 2, are provided in proximity to a surface of the active area. On the active area, a gate insulation film 40 of the selection transistor 2 and a gate electrode 41 that functions as a word line WLn are provided. An insulation layer 20 is provided on the semiconductor substrate 100 and the selection transistor 2.

The MTJ element 1 has a bottom surface coupled via the BEC plug 21 to the diffusion layer 101, and a top surface coupled via the TEC plug 42 to the interconnect layer 43 that functions as a bit line BLm. The interconnect layer 45 that functions as a source line SLm is coupled to the diffusion layer 102 via the contact plug 44.

3.3 Advantageous Effects according to Present Embodiment

The MTJ element 1 described in the first and second embodiments can be applied to the MEAN (magnetic memory device) according to the present embodiment 4. Modifications The embodiments are not limited to the above-described aspects, but can be modified in various ways.

For example, the first to third embodiments can be combined as far as possible. For example, the first embodiment may be combined with the first example of the second embodiment to form an interface layer 13b (e.g. CoFeB) on the interface layer 14 of the first embodiment.

The terms "connect" and "couple" in the above-described embodiments include not only the state of direct connection or coupling but also the state of indirect connection or coupling via a transistor, a resistor or the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic memory device comprising:
a first magnetic layer having a variable magnetization direction;
a first non-magnetic layer provided on the first magnetic layer; and
a second magnetic layer provided on the first non-magnetic layer and having a fixed magnetization direction,
wherein the second magnetic layer includes:
a first magnetic region directly provided on the first non-magnetic layer and not including a non-magnetic metal that includes Mo (molybdenum);
a second magnetic region provided on the first magnetic region and including the non-magnetic metal;
a first non-magnetic region provided on the second magnetic region; and
a third magnetic region provided on the first non-magnetic region and not including the non-magnetic metal.

2. A magnetic memory device comprising:
a first magnetic layer having a variable magnetization direction;
a first non-magnetic layer provided on the first magnetic layer; and
a second magnetic layer provided on the first non-magnetic layer and having a fixed magnetization direction,
wherein the second magnetic layer includes:
a first magnetic region that includes:
a third magnetic layer directly provided on the first non-magnetic layer and not including a non-magnetic metal that includes Mo;
a second non-magnetic layer provided on the third magnetic layer and including the non-magnetic metal; and
a fourth magnetic layer provided on the second non-magnetic layer,
a first non-magnetic region provided on the first magnetic region; and a second magnetic region provided on the first non-magnetic region and not including the non-magnetic metal.

3. The device according to claim 2, wherein the fourth magnetic layer includes the non-magnetic metal.

4. The device according to claim 2, wherein the first magnetic region further includes:
a third non-magnetic layer provided on the fourth magnetic layer and not including the non-magnetic metal; and
a fifth magnetic layer provided on the third non-magnetic layer.

5. The device according to claim 1, wherein the first magnetic layer includes at least one of Co (cobalt), Fe (iron), and boron (B).

6. The device according to claim 1, wherein the first non-magnetic layer includes at least one of MgO (magnesium oxide) and $Al_2O_3$ (aluminum oxide).

7. The device according to claim 1, wherein the second magnetic layer includes at least one of Co, Fe, and Ni.

8. The device according to claim 1, wherein the second magnetic region includes at least one of a multi-layered film made of Co and Pt (platinum), a multi-layered film made of Co and Ni, a multi-layered film made of Co and Pd (palladium), a CoPt alloy film, a CoNi alloy film, and a CoPd alloy film.

9. The device according to claim 1, further comprising a third magnetic layer provided on the second magnetic layer.

10. A magnetic memory device comprising:
a first magnetic layer having a variable magnetization direction;
a first non-magnetic layer provided on the first magnetic layer; and
a second magnetic layer provided on the first non-magnetic layer and having a fixed magnetization direction,
wherein the second magnetic layer includes:
a first magnetic region directly provided on the first non-magnetic layer and not including a non-magnetic metal that includes Mo;
a second magnetic region provided on the third magnetic region and including the non-magnetic metal;
a first non-magnetic region provided on the first magnetic region; and
a third magnetic region provided on the first non-magnetic region and not including the non-magnetic metal, and
a concentration of the non-magnetic metal in an interface between the first magnetic region and the second magnetic layer is lower than a concentration of the non-magnetic metal in an interface between the second magnetic region and the first non-magnetic region.

11. The device according to claim 10, wherein a concentration of the non-magnetic metal in the second magnetic region increases from the interface between the first magnetic region and the second magnetic layer toward the interface between the second magnetic region and the first non-magnetic region.

12. The device according to claim 10, wherein the second magnetic layer includes at least one of Co, Fe, and Ni.

13. The device according to claim 10, wherein the second magnetic region includes at least one of a multi-layered film made of Co and Pt, a multi-layered film made of Co and Ni, a multi-layered film made of Co and Pd, a CoPt alloy film, a CoNi alloy film, and a CoPd alloy film.

14. A method of manufacturing a magnetic memory device comprising:
forming a first magnetic layer having a variable magnetization direction;
forming a first non-magnetic layer on the first magnetic layer; and
forming a second magnetic layer on the first non-magnetic layer, the second magnetic layer having a fixed magnetization direction,
wherein the forming the second magnetic layer comprises:
forming a first magnetic region directly on the first non-magnetic layer, the first magnetic region not including that includes Mo;
forming a second magnetic region including the non-magnetic metal on the first magnetic region;
forming a first non-magnetic region on the second magnetic region; and
forming a third magnetic region not including the non-magnetic metal on the first non-magnetic region.

15. A method of manufacturing a magnetic memory device comprising:
forming a first magnetic layer having a variable magnetization direction;
forming a first non-magnetic layer on the first magnetic layer; and
forming a second magnetic layer on the first non-magnetic layer, the second magnetic layer having a fixed magnetization direction,
wherein the forming the second magnetic layer comprises:
forming a first magnetic region;
forming a first non-magnetic region on the first magnetic region; and
forming a second magnetic region not including the non-magnetic metal on the first non-magnetic region,
wherein the forming the first magnetic region that includes:
forming a third magnetic layer not including the non-magnetic metal on the first non-magnetic region;
forming a second non-magnetic layer including the non-magnetic metal on the third magnetic layer; and
removing the second non-magnetic layer and a part of the third magnetic layer and introducing the non-magnetic metal to the third magnetic layer.

16. The device according to claim 10, wherein the first magnetic layer includes at least one of Co, Fe, and B.

17. The device according to claim 10, wherein the first non-magnetic layer includes at least one of MgO and $Al_2O_3$.

18. The device according to claim 2, wherein the first magnetic layer includes at least one of Co, Fe, and B.

19. The device according to claim 2, wherein the first non-magnetic layer includes at least one of MgO and $Al_2O_3$.

20. The device according to claim 2, wherein the second magnetic layer includes at least one of Co, Fe, and Ni.

* * * * *